(12) United States Patent
Maeda et al.

(10) Patent No.: US 6,355,505 B1
(45) Date of Patent: Mar. 12, 2002

(54) HEAT SINK AND METHOD OF MANUFACTURING HEAT SINK

(75) Inventors: Hiroshi Maeda; Mamoru Fujisawa; Yoshikazu Hanada, all of Minamiashigara (JP)

(73) Assignee: Fuji Photo Film Co., Ltd., Kanagawa-Ken (JP)

(*) Notice: Subject to any disclaimer, the term of this patent is extended or adjusted under 35 U.S.C. 154(b) by 0 days.

(21) Appl. No.: 09/286,420

(22) Filed: Apr. 6, 1999

(51) Int. Cl.[7] .............................................. H01L 21/44
(52) U.S. Cl. ............................ 438/122; 438/25; 438/26; 438/29
(58) Field of Search ................................. 438/122, 116, 438/25, 26, 29, 42, 43, 33, 27, 28

(56) References Cited

U.S. PATENT DOCUMENTS 5,500,077 A * 3/1996 Nishibayashi et al. ...... 438/105
5,943,553 A * 8/1999 Spaeth ........................ 438/29
6,025,213 A * 2/2000 Nemoto et al. ............. 438/122

* cited by examiner

Primary Examiner—Kevin M. Picardat
(74) Attorney, Agent, or Firm—Sughrue Mion, PLLC

(57) ABSTRACT

Heat sinks for semiconductor laser devices are manufactured by processing a surface of a panel into a mirror surface, forming a plurality of substantially parallel photomasks spaced at predetermined intervals on the mirror surface, etching the mirror surface through the photomasks to define grooves, the grooves and the mirror surface jointly providing edges therebetween, removing the photomasks from the panel, and thereafter, cutting the panel along the grooves into a plurality of heat sinks. Each of the heat sinks has a surface having a desired ultrahigh level of surface finish accuracy up its edge, and can be manufactured relatively inexpensively.

15 Claims, 16 Drawing Sheets

F I G. 2
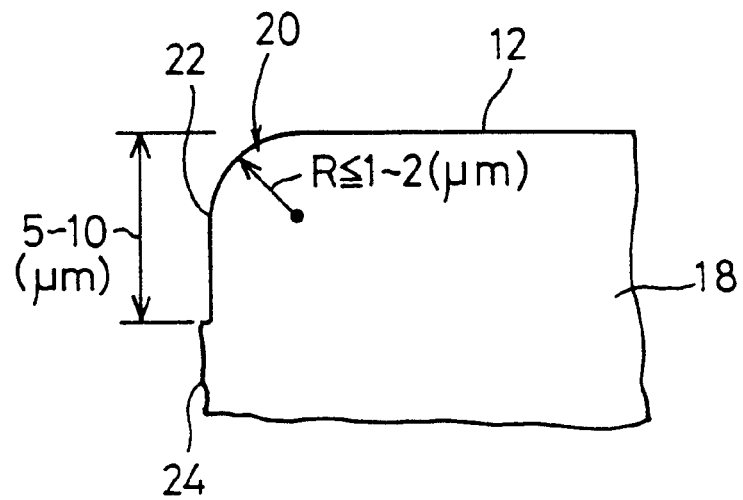
F I G. 3
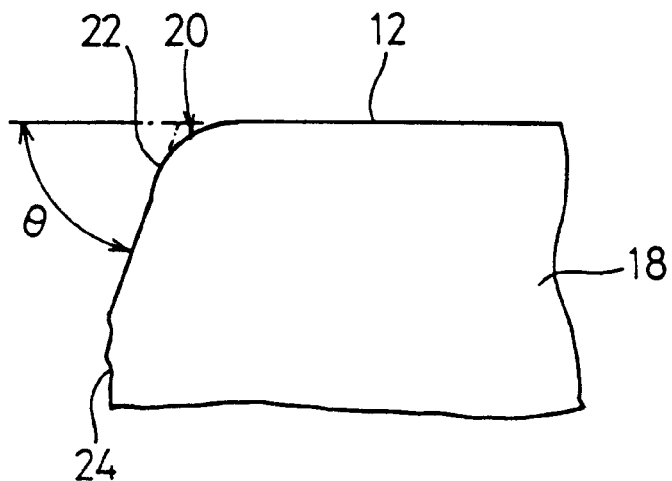

F I G. 26
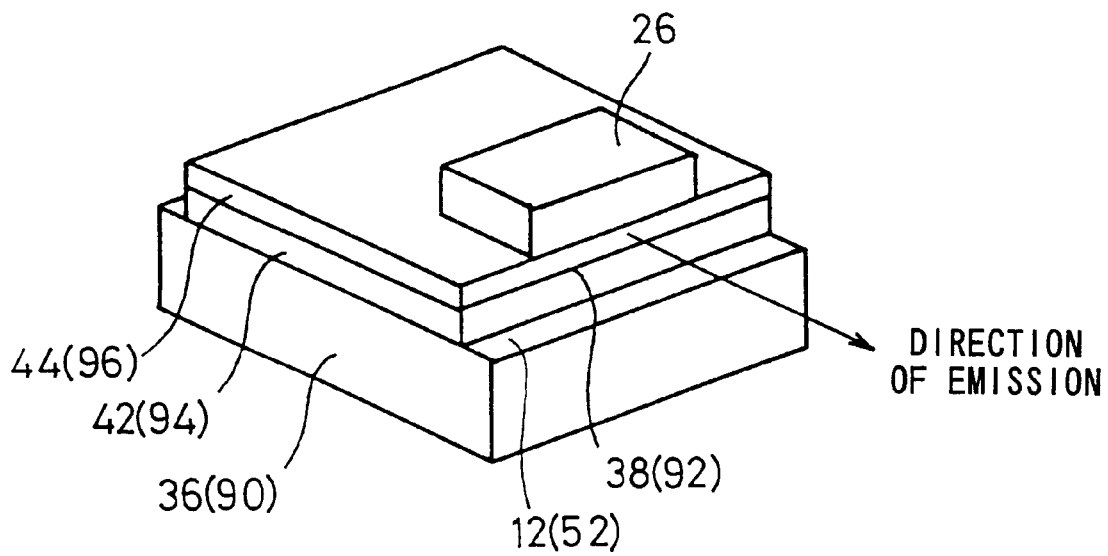
F I G. 27
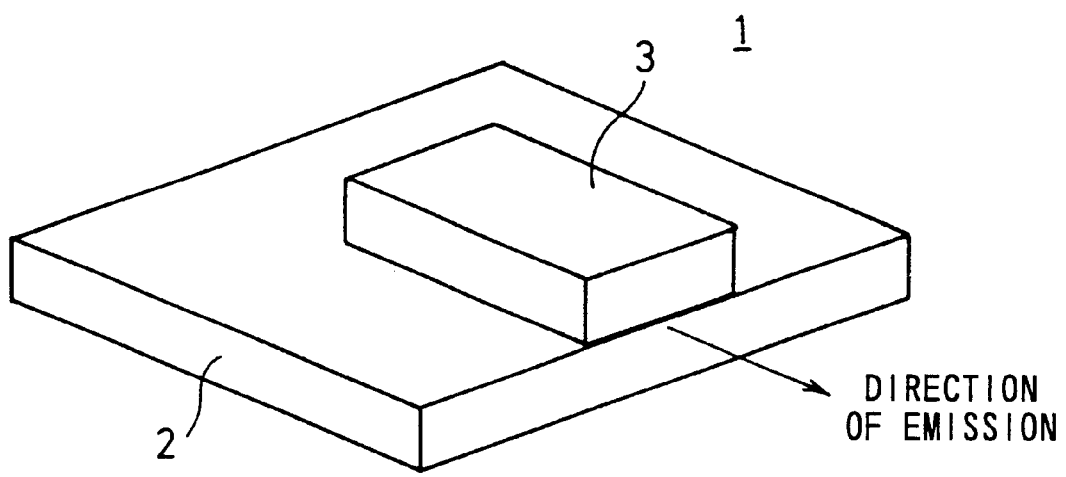

HEAT SINK AND METHOD OF MANUFACTURING HEAT SINK

BACKGROUND OF THE INVENTION

1. Field of the Invention

The present invention relates to a heat sink which integrally carries a semiconductor laser chip as part of a semiconductor laser device, and a method of manufacturing such a heat sink.

2. Description of the Related Art

Semiconductor laser devices (hereinafter referred to as "LD") have heretofore widely been used in various fields including electricity, electronics, communications, etc.

As shown in FIG. 27 of the accompanying drawings, an LD 1 comprises a heat sink 2 and a semiconductor laser chip (hereinafter referred to as "LD chip") 3 disposed on and integrally coupled to the heat sink 2. A laser beam is emitted from ends of the heat sink 2 and the LD chip 3 where they lie flush with each other.

The LD chip 3 is bonded to the heat sink 2 which is highly thermally conductive in order to prevent the LD chip 3 from being destroyed due to its own heat buildup developed when the LD chip 3 emits a laser beam. The heat sink 2 is made of a copper-based material of good thermal conductivity for efficiently absorbing the heat of the LD chip 3 and allowing the LD chip 3 to emit a laser beam highly efficiently.

In order to radiate the heat from the LD chip 3 reliably, the LD chip 3 and the heat sink 2 need to be held in close contact with each other over their entire contact surfaces. The surface of the heat sink 2 to which the LD chip 3 is bonded is required to have an ultra-accurate level of surface roughness and surface flatness in its entirety up to their edges. Specifically, the heat sink 2 should preferably be a heat sink 2a (see FIG. 28 of the accompanying drawings) whose cross-sectional shape exhibits an ultra-accurate level of surface roughness and surface flatness. A heat sink 2b (see FIG. 29 of the accompanying drawings) having a large level of surface roughness and a poor level of surface flatness, and a heat sink 2c (see FIG. 30 of the accompanying drawings) with a burr 4 on an edge thereof are not suitable for use with an LD chip.

It is necessary that the end of the heat sink 2 be free of any burrs at its edge close to the LD chip 3 so as not to obstruct the laser beam emitted from the LD chip 3. More specifically, as shown in FIG. 31 of the accompanying drawings, if the heat sink 2a having an ultra-accurate level of surface roughness and surface flatness and free of any burrs at its edges is used, then it can efficiently absorb the heat of the LD chip 3 and allow the LD chip 3 to radiate the emitted laser beam highly efficiently. However, as shown in FIG. 32 of the accompanying drawings, if a heat sink 2d with a large drooping surface 5 present on an edge thereof is used, then the ends of the LD chip 3 and the heat sink 2d from which a laser beam is emitted are not held in intimate contact with each other, but spaced from each other by a clearance 6. Therefore, the LD chip 3 suffers poor heat radiation, and may be broken due to its own heat buildup. As shown in FIG. 33 of the accompanying drawings, if a heat sink 2c with a burr 4 present on an edge thereof is used, then the burr 4 blocks the laser beam emitted from the LD chip 3, and hence causes a lack of laser beam output power.

To meet the strict requirements for the heat sink 2, it has been the conventional practice to manufacture the heat sink 2 as follows: The surface of a panel of heat sink stock on which the LD chip 3 is to be mounted is machined by precision grinding, lapping, or the like, and then a heat sink 2 of desired shape is blanked out of the panel of heat sink stock by a press or cut off the panel of heat sink stock by a cutting machine. According to the lapping process, the surface of the panel of heat sink stock is polished by an abrasive material.

However, the above conventional manufacturing process fails to produce heat sinks having an ultrahigh level of surface finish accuracy (surface roughness and surface flatness) at a stable rate, and tends to result in large burrs and drooping surfaces on edges of produced heat sinks.

Furthermore, the conventional manufacturing process requires large investments to be made in the purchase of mechanical facilities for machining heat sinks. As a consequence, the cost of heat sinks produced by the conventional manufacturing process is relatively high.

Recent years have seen demands for more efficient absorption of an increased heat buildup in high-power LDs.

SUMMARY OF THE INVENTION

It is a main object of the present invention to provide a heat sink which has a desired ultrahigh level of surface finish accuracy over an entire surface thereof up to its edges and which can be manufactured relatively inexpensively, and a method of manufacturing such a heat sink.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 2 is an enlarged fragmentary view of an edge of a heat sink shown in FIG. 1F, as viewed in the direction indicated by the arrow X therein;

FIG. 3 is an enlarged fragmentary view of a modification of the edge shown in FIG. 2;

FIG. 26 is a perspective view illustrative of a modified process of manufacturing a heat sink;

FIG. 27 is a perspective view of a semiconductor laser device;

DESCRIPTION OF THE PREFERRED EMBODIMENTS

A process of manufacturing a heat sink according to a first embodiment of the present invention will first be described below with reference to FIGS. 1A through 1G.

Figure 1A:
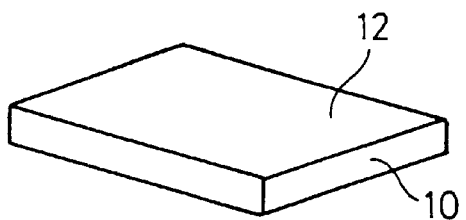
FIGS. 1A through 1G are perspective views illustrative of a process of manufacturing a heat sink according to a first embodiment of the present invention.

As shown in FIG. 1A, a surface of a panel (base) 10 made of oxygen-free copper is ground into a mirror surface 12 by a single-point tool of diamond, for example. The mirror surface 12 has a desired ultra-accurate level of surface roughness and surface flatness.

Figure 1B:
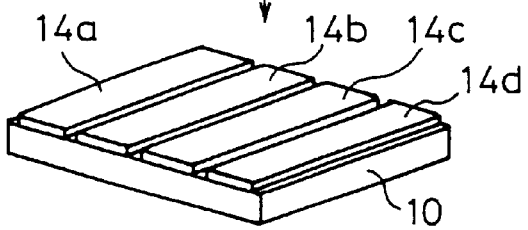
Figure 1C:
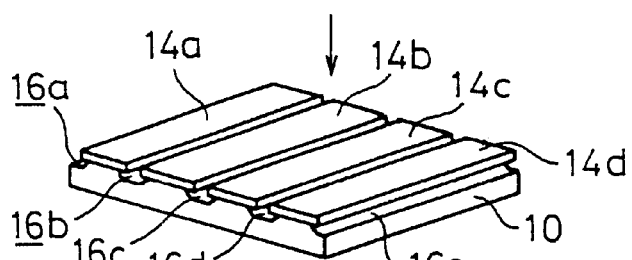
Figure 1D:
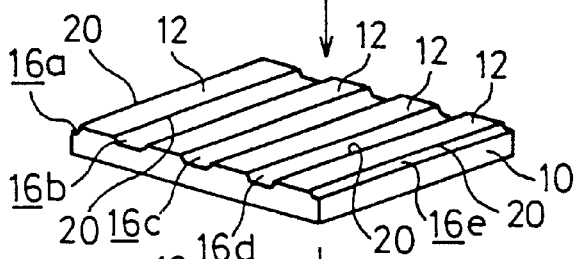
Figure 1E:
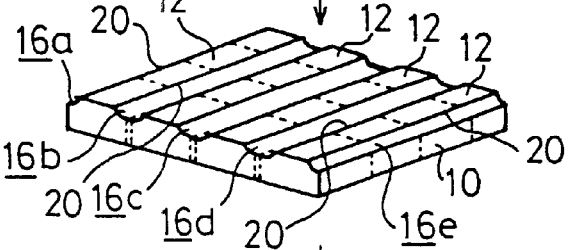

Then, as shown in FIG. 1B, etching photomasks 14a through 14d are deposited on the mirror surface 12 of the panel 10. The etching photomasks 14a through 14d, each of an elongate rectangular shape, are spaced at substantially equal intervals and extend substantially parallel to each other.

Then, an etchant (not shown) is applied to etch the mirror surface 12 between the etching photomasks 14a through 14d, producing grooves 16a through 16e (see FIG. 1C) each of an arcuate cross section in the mirror surface 12 between the etching photomasks 14a through 14d and also in opposite ends of the panel 10. The grooves 16a through 16e extend longitudinally along the etching photomasks 14a through 14d.

After the etching photomasks 14a through 14d have been removed from the panel 10 (see FIG. 1D), the panel 10 is linearly cut along the grooves 16a through 16e by a wire cutting machine or the like, producing elongate segments. The elongate segments are then transversely cut to desired dimensions along the dotted lines, thereby producing a plurality of heat sinks 18 (see FIGS. 1E, 1F).

Figure 1F:
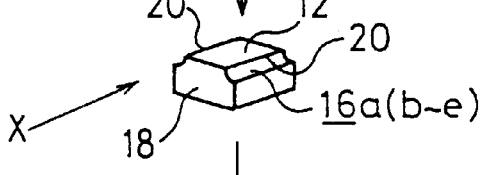

FIGS. 2 and 3 show at enlarged scale an edge 20 of each of the heat sinks 18 thus produced, as viewed in the direction indicated by the arrow X in FIG. 1F.

The edge 20 has a ridge 22 contiguous to the mirror surface 12 which has been finished to an ultrahigh level of surface finish accuracy (surface roughness and surface flatness). The ridge 22 is defined by an arcuate cross-sectional shape having a radius R of curvature ranging from 1 to 2 $\mu$m. The ridge 22 which extends downwardly from the mirror surface 12 may have a vertical extent ranging from 5 to 10 $\mu$m from the mirror surface 12.

Figure 31:
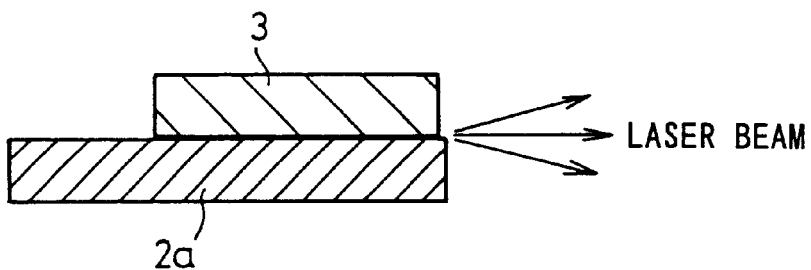
FIG. 31 is a cross-sectional view the manner in which a semiconductor laser device with an acceptable heat sink edge operates.
Figure 32:
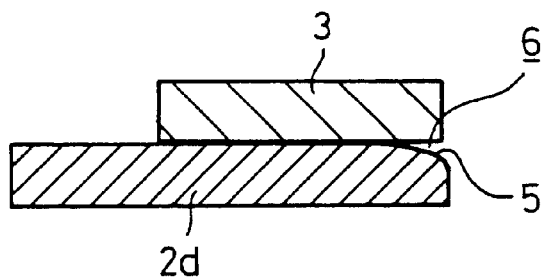
FIG. 32 is a cross-sectional view the manner in which a semiconductor laser device with an unacceptable heat sink edge operates.
Figure 33:
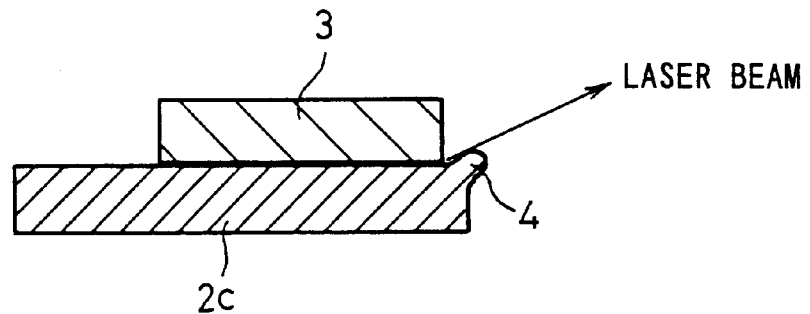
FIG. 33 is a cross-sectional view the manner in which a semiconductor laser device with another unacceptable heat sink edge operates.

In order to perform the function of the semiconductor laser device as shown in FIG. 31, a wall surface 24 of the heat sink 18 beneath the ridge 22 which extends vertically downwardly 5 to 10 $\mu$m from the mirror surface 12 does not necessarily need to extend perpendicularly to the mirror surface 12 or to have a straight cross-sectional shape. As shown in FIG. 3, the ridge 22 of the edge 20 may be inclined to the mirror surface 12 at an angle $\theta$ of at least about 45°, and may not need to be straight.

Figure 1G:

As shown in FIG. 1G, a semiconductor laser chip (hereinafter referred to as "LD chip") 26 is fixed to the mirror surface 12 of the heat sink 18 by a brazing filler metal or the like. Now, a semiconductor laser device (hereinafter referred to as "LD") 28 is completed.

The above manufacturing process allows the edge 20 to be produced stably with an ultrahigh level of surface finish accuracy and free of any unwanted burrs and drooping surfaces. The manufacturing process can simultaneously produce a plurality of heat sinks 18 and does not require large investments to be made in manufacturing facilities. Therefore, the heat sinks 18 can be manufactured relatively inexpensively.

A process of manufacturing a heat sink according to a second embodiment of the present invention will first be described below with reference to FIGS. 4A through 4G. Those parts shown in FIGS. 4A through 4G which are identical to those shown in FIGS. 1A through 1G are denoted by identical reference characters, and will not be described in detail below.

Figure 4A:
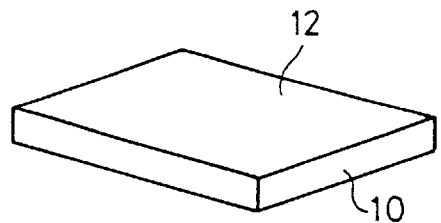
FIGS. 4A through 4G are perspective views illustrative of a process of manufacturing a heat sink according to a second embodiment of the present invention.

As shown in FIG. 4A, a surface of a panel 10 made of oxygen-free copper is ground into a mirror surface 12 by a single-point tool of diamond, for example. The mirror surface 12 has a desired ultra-accurate level of surface roughness and surface flatness.

Figure 4B:
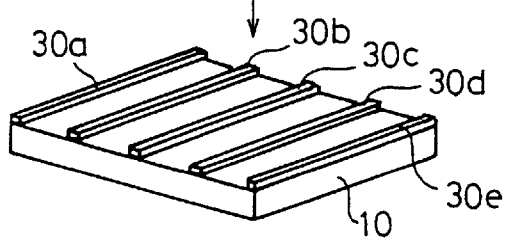
Figure 4C:
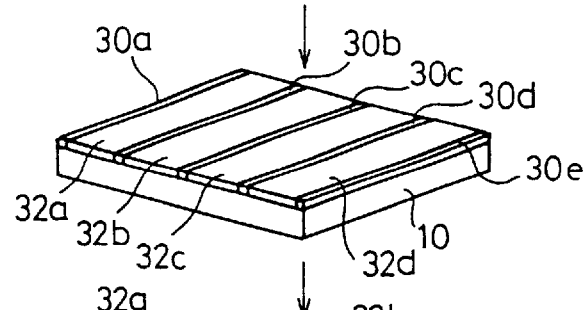
Figure 4D:
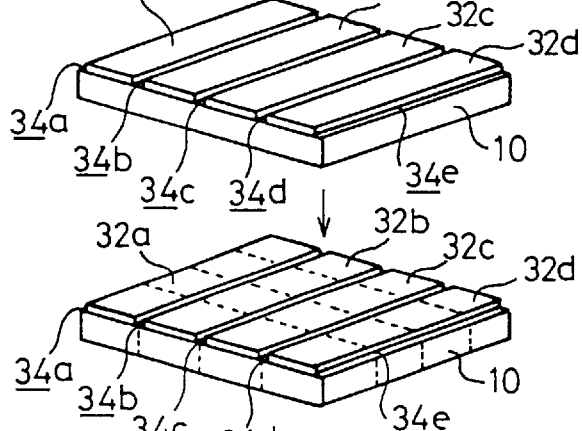
Figure 4E:
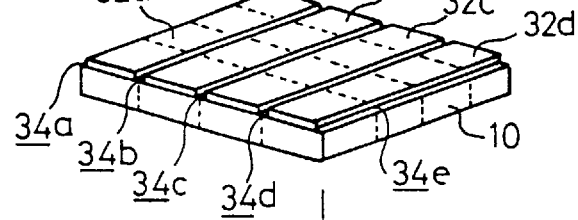
Figure 4F:
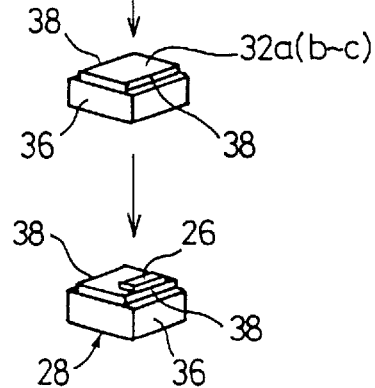

Then, as shown in FIG. 4B, plating masks 30a through 30e are deposited on the mirror surface 12 of the panel 10. The plating masks 30a through 30e, each in the shape of a strip, are spaced at substantially equal intervals and extend substantially parallel to each other.

Then, the mirror surface 12 between the plating masks 30a through 30e is electroplated, using a plating solution of copper, producing a plated layer of copper having a desired thickness (see FIG. 4C) between the plating masks 30a through 30e.

The plating masks 30a through 30e are removed from the panel 10, leaving a plurality of substantially parallel projections 32a through 32d, each in the shape of a strip, of the plated layer on the mirror surface 12. Since the plating masks 30a through 30e have been removed, grooves 34a through 34e (see FIG. 4D) are present between the projections 32a through 32d and at opposite ends of the panel 10.

Figure 4G:

The panel 10 is linearly cut along the grooves 34a through 34e by a wire cutting machine or the like, producing elongate segments. The elongate segments are then transversely cut to desired dimensions along the dotted lines, thereby producing a plurality of heat sinks 36 (see FIGS. 4E, 4F). As shown in FIG. 4G, an LD chip 26 is then fixed to each of the heat sinks 36 by a brazing filler metal or the like. Now, an LD 28 is completed.

The heat sink 36 thus manufactured has an edge 38 which is of a shape similar to that of the heat sink 18 produced by the etching process according to the first embodiment, and offers the same advantages as those of the first embodiment.

A process of manufacturing a heat sink according to a third embodiment of the present invention will be described below with FIGS. 5 through 15.

Figure 5:
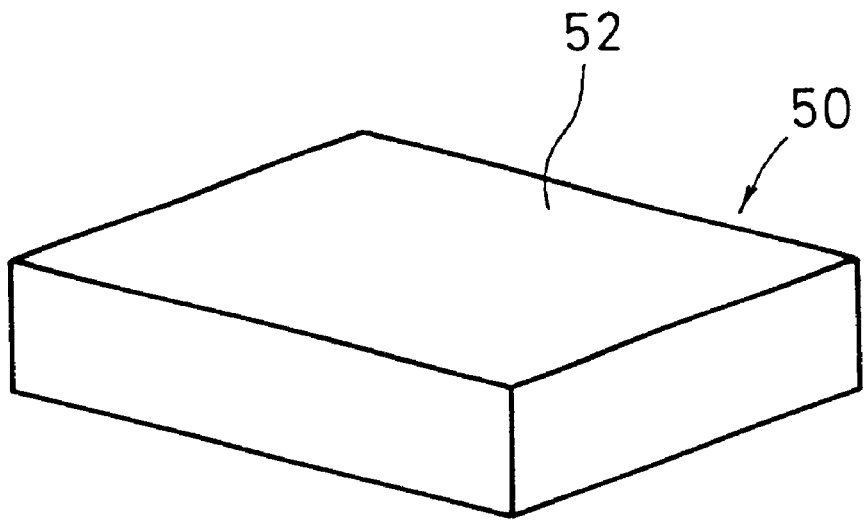
FIG. 5 is a perspective view of a panel of heat sink stock used in a process of manufacturing a heat sink according to a third embodiment of the present invention.

As shown in FIG. 5, a surface of a panel 50 made of oxygen-free copper is ground by a single-point tool of diamond or polished by a CMP (chemical and mechanical polishing) process, for example, producing a mirror surface 52. The mirror surface 52 has a desired ultra-accurate level of surface roughness and surface flatness.

Figure 6:
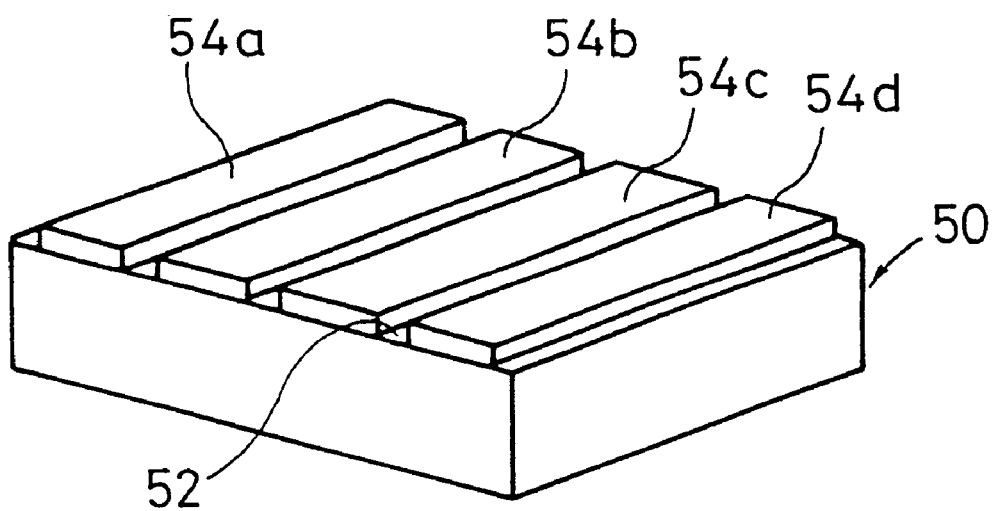
FIG. 6 is a perspective view of the panel of heat sink stock shown in FIG. 5 with rough etching photomasks deposited thereon.
Figure 7:
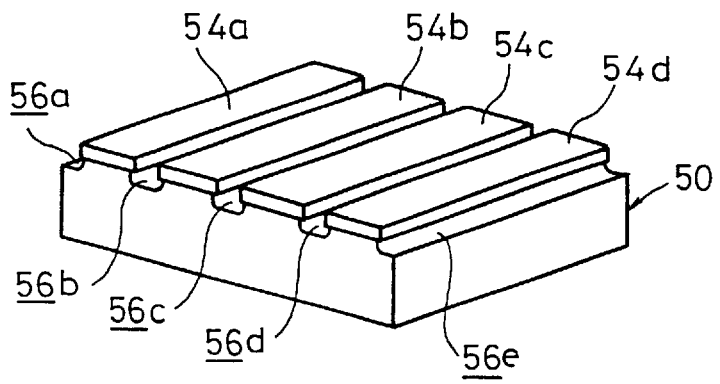
FIG. 7 is a perspective view of the panel of heat sink stock shown in FIG. 6 which has been processed by a rough etching process.
Figure 8:
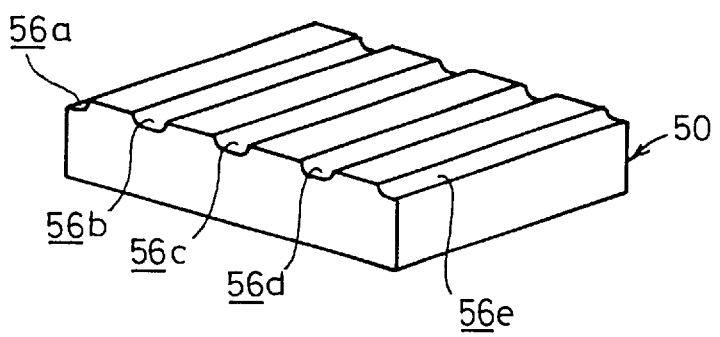
FIG. 8 is a perspective view of the panel of heat sink stock shown in FIG. 7 from which the rough etching photomasks have been removed.
Figure 9:
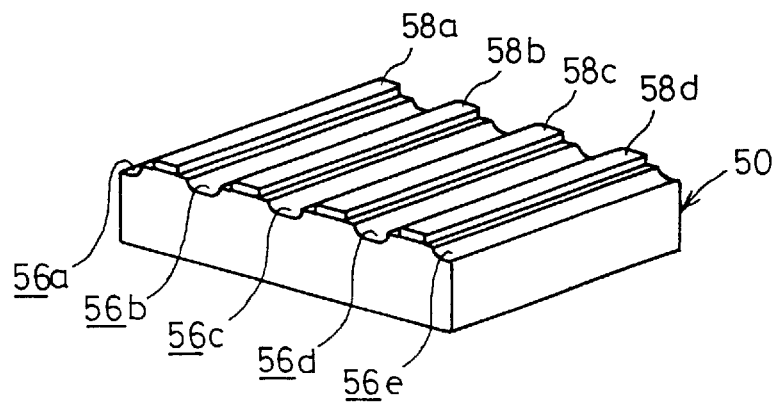
FIG. 9 is a perspective view of the panel of heat sink stock shown in FIG. 8 with finish etching photomasks deposited thereon.
Figure 10:
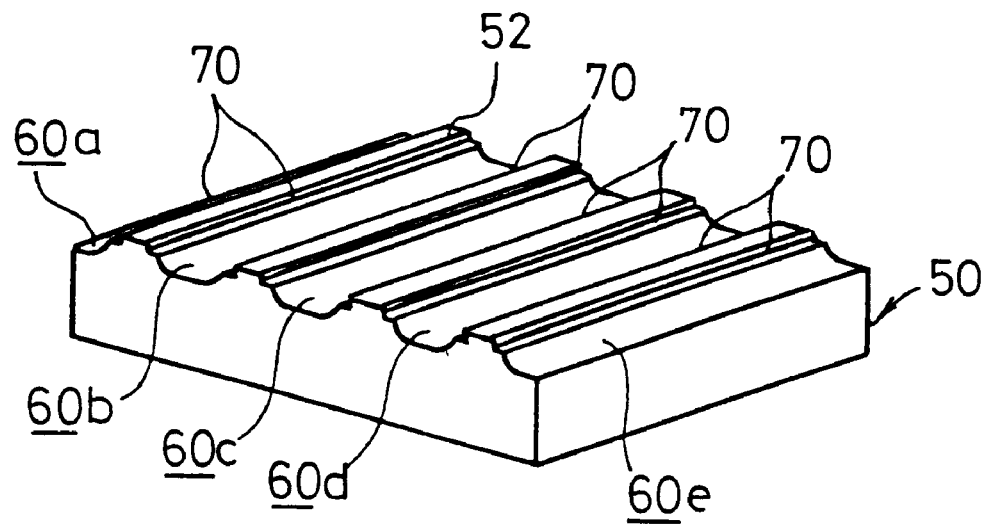
FIG. 10 is a perspective view of the panel of heat sink stock shown in FIG. 9 from which the finish etching photomasks have been removed.
Figure 11:
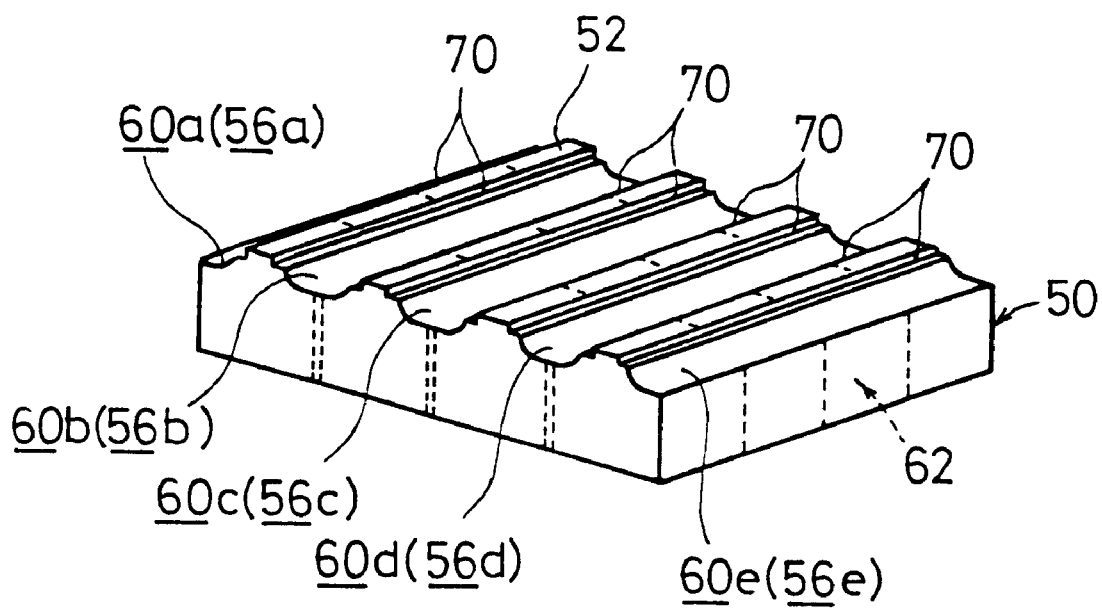
FIG. 11 is a perspective view of the panel of heat sink stock shown in FIG. 10 which has been cut.

Then, as shown in FIG. 6, a plurality of elongate rectangular rough etching photomasks (first photomasks) 54a through 54d are deposited on the mirror surface 52. The rough etching photomasks 54a through 54d are spaced at substantially equal intervals and extend substantially parallel to each other.

Then, an etchant (not shown) is applied to etch the mirror surface 52 between the rough etching photomasks 54a through 54d, producing first grooves 56a through 56e (see FIG. 7) each of an arcuate cross section in the mirror surface 52 between the rough etching photomasks 54a through 54d and also in opposite ends of the panel 50. The first grooves 56a through 56e extend longitudinally along the rough etching photomasks 54a through 54d, with elongate lands left on the mirror surface 52 therebetween.

After the rough etching photomasks 54a through 54d have been removed from the panel 50 (see FIG. 8), a plurality of elongate rectangular finish etching photomasks (second photomasks) 58a through 58d (see FIG. 9) are deposited on the lands of the mirror surface 52 between the first grooves 56a through 56e. The finish etching photomasks 58a through 58d are spaced at substantially equal intervals and extend substantially parallel to each other. The finish etching photomasks 58a through 58d are several tens of micrometer narrower than the lands of the mirror surface 52 between the first grooves 56a through 56e.

Then, an etchant (not shown) is applied to etch the mirror surface 52 between the finish etching photomasks 58a through 58d and the first grooves 56a through 56e, producing second grooves 60a through 60e (see FIG. 10) each of an arcuate cross section, which replace and are wider and deeper than the first grooves 56a through 56e. The grooves 60a through 60e extend longitudinally along the finish etching photomasks 58a through 58d.

After the finish etching photomasks 58a through 58d have been removed from the panel 50 (see FIG. 11), the panel 50 is linearly cut along the second grooves 60a through 60e by a wire cutting machine or the like, producing elongate segments. The elongate segments are then transversely cut to desired dimensions along the dotted lines, thereby producing a plurality of heat sinks 62 (see FIG. 12).

Figure 13:
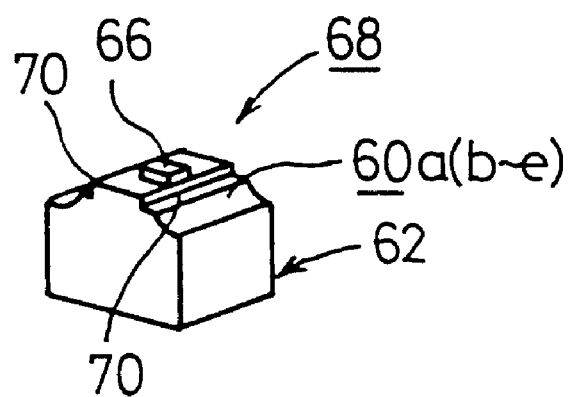
FIG. 13 is a perspective view of the heat sink shown in FIG. 12 on which an LD chip is fixedly mounted.

As shown in FIG. 13, an LD chip 66 is then fixed to each of the heat sinks 62 by a brazing filler metal or the like. Now, an LD 68 is completed.

Figure 12:
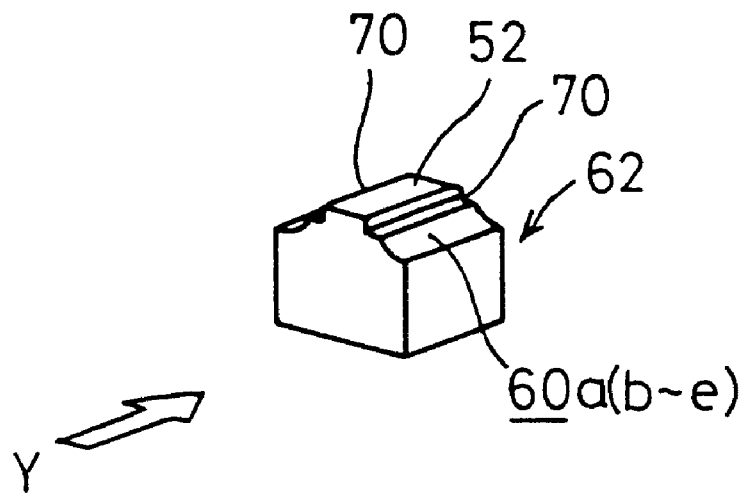
FIG. 12 is a perspective view of a heat sink cut off the panel of heat sink stock shown in FIG. 11.
Figure 14:
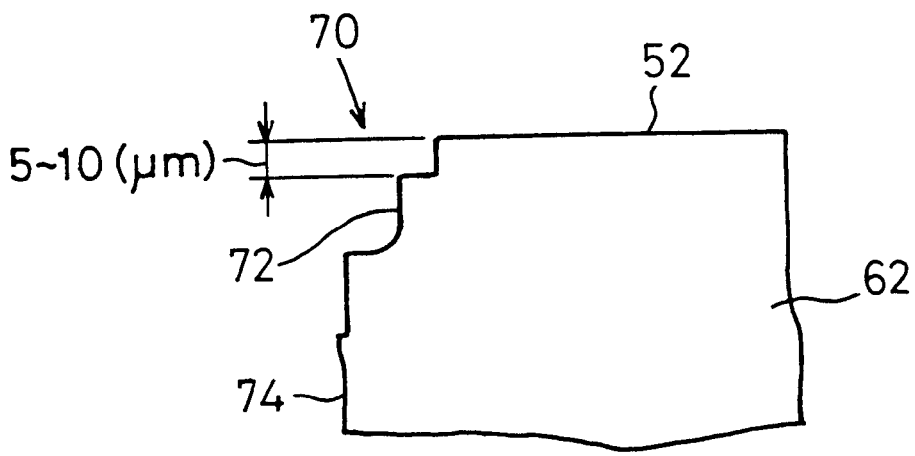
FIG. 14 is an enlarged fragmentary view of an edge of the heat sink shown in FIG. 12, as viewed in the direction indicated by the arrow Y therein.
Figure 15:
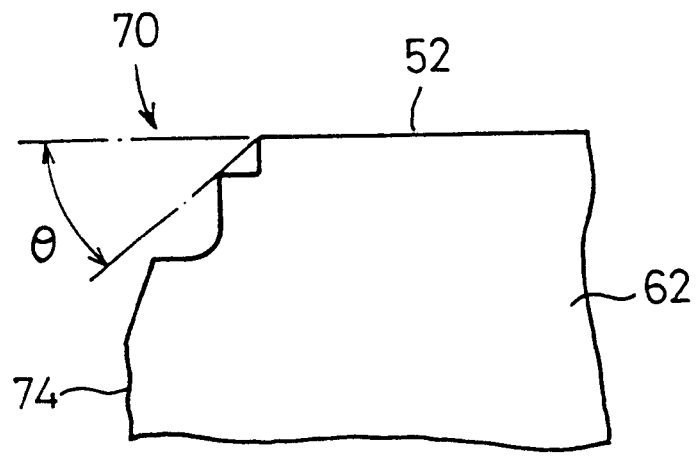
FIG. 15 is an enlarged fragmentary view of a modification of the edge shown in FIG. 14.

FIGS. 14 and 15 show at enlarged scale an edge 70 of each of the heat sinks 68 thus produced, as viewed in the direction indicated by the arrow Y in FIG. 12.

The edge 70 has a sharp vertical edge surface 72 free of drooping surfaces, produced by the second etching process and contiguous to the mirror surface 52 which has been finished to an ultrahigh level of surface finish accuracy (surface roughness and surface flatness). For preventing vignetting of the laser beam emitted from the semiconductor laser device as shown in FIG. 31, the vertical edge surface 72 may be spaced downwardly from the mirror surface 52 by 5 to 10 μm.

In order to perform the function of the semiconductor laser device as shown in FIG. 31, a wall surface 74 of the heat sink 62 beneath the vertical edge surface 72 which extends vertically downwardly 5 to 10 μm from the mirror surface 52 does not necessarily need to extend perpendicularly to the mirror surface 52 or to have a straight cross-sectional shape. As shown in FIG. 15, the edge 70 may be inclined to the mirror surface 52 at an angle θ of at least about 45°, and may not need to be straight.

The manufacturing process according to the third embodiment allows the edge 70 to be produced stably with an ultrahigh level of surface finish accuracy and free of any unwanted burrs and drooping surfaces. Since the manufacturing process according to the third embodiment has two etching processes, i.e., the rough and finish etching processes, even if burrs are produced on the mirror surface 52 when it is vertically etched deeply in the rough etching process, such burrs can easily and reliably be removed by the finish etching process. The manufacturing process can simultaneously produce a plurality of heat sinks 62 and does not require large investments to be made in manufacturing facilities. Therefore, the heat sinks 62 can be manufactured relatively inexpensively.

In the third embodiment, the rough etching process is performed as a first etching process, and thereafter the finish etching process is carried out as a second etching process. However, a precision etching process may first be performed as a first etching process, after which a deep etching process may be effected as a second etching process.

A process of manufacturing a heat sink according to a fourth embodiment of the present invention will be described below with FIGS. 16 through 25. Those parts shown in FIGS. 16 through 25 which are identical to those shown in FIGS. 5 through 15 are denoted by identical reference characters, and will not be described in detail below.

Figure 16:
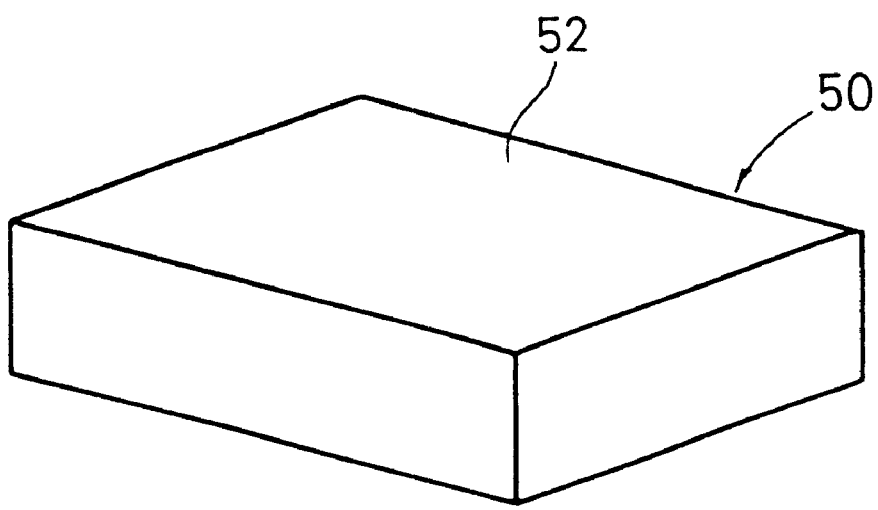
FIG. 16 is a perspective view of a panel of heat sink stock used in a process of manufacturing a heat sink according to a fourth embodiment of the present invention.

As shown in FIG. 16, a surface of a panel 50 made of oxygen-free copper is ground into a mirror surface 52 by a single-point tool of diamond, for example. The mirror surface 52 has a desired ultra-accurate level of surface roughness and surface flatness.

Figure 17:
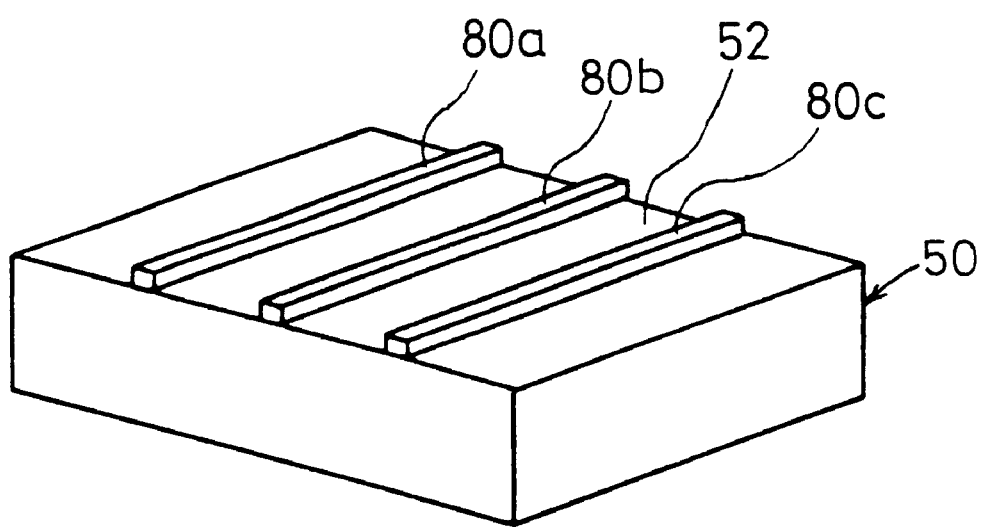
FIG. 17 is a perspective view of the panel of heat sink stock shown in FIG. 16 with rough plating masks deposited thereon.
Figure 18:
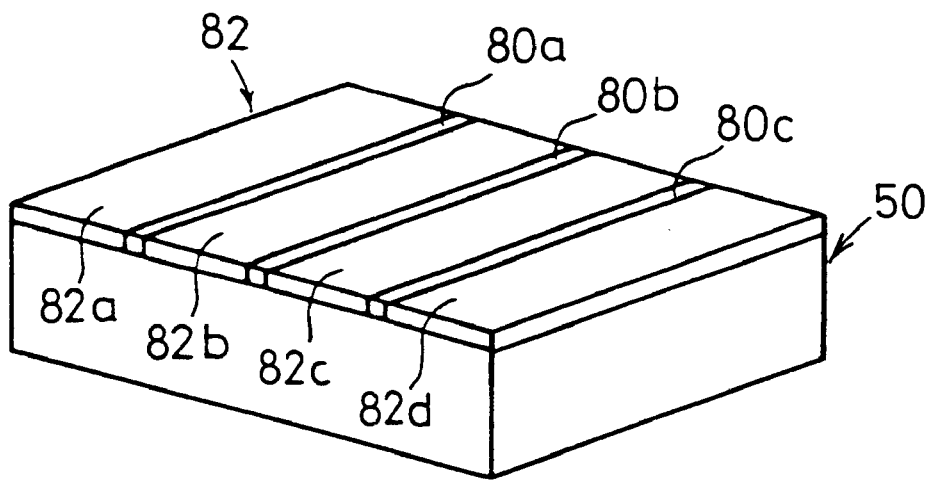
FIG. 18 is a perspective view of the panel of heat sink stock shown in FIG. 17 which has been processed by a rough plating process.
Figure 19:
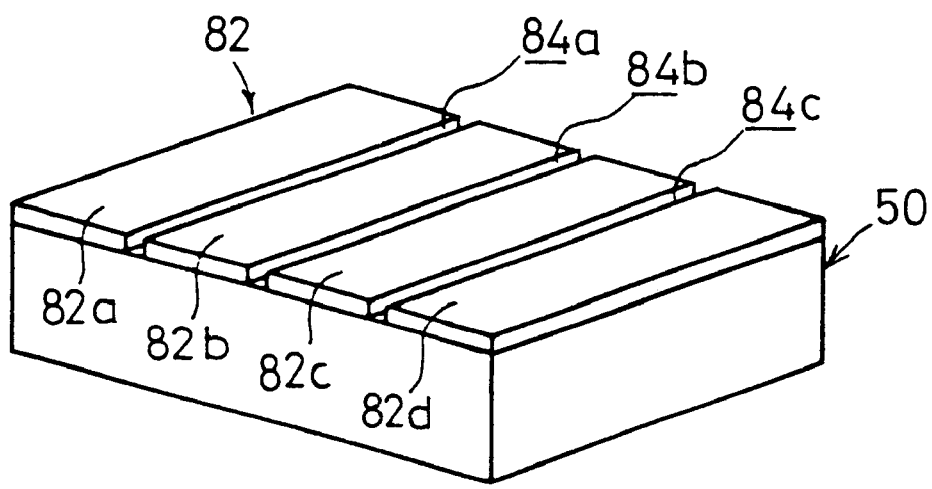
FIG. 19 is a perspective view of the panel of heat sink stock shown in FIG. 18 from which the rough plating masks have been removed.
Figure 20:
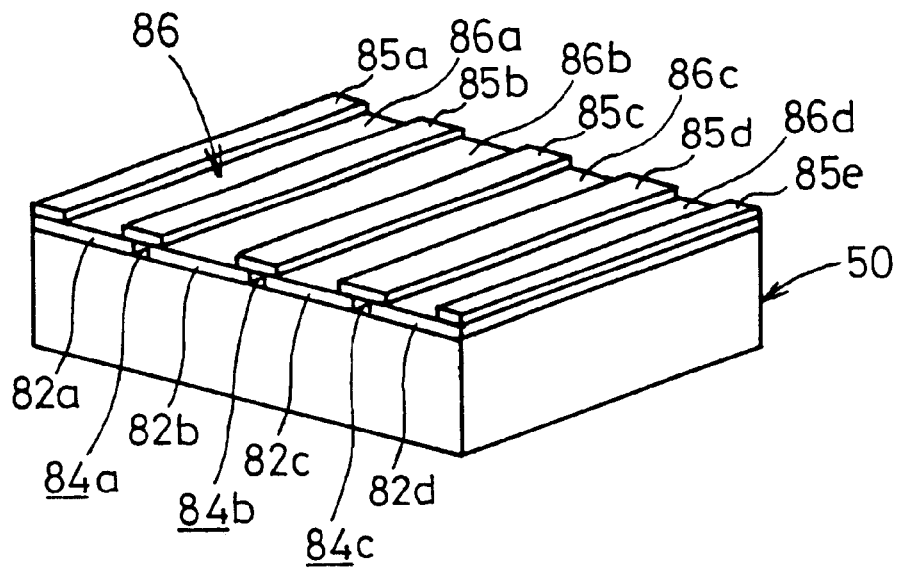
FIG. 20 is a perspective view of the panel of heat sink stock shown in FIG. 19 with finish plating masks deposited thereon.
Figure 21:
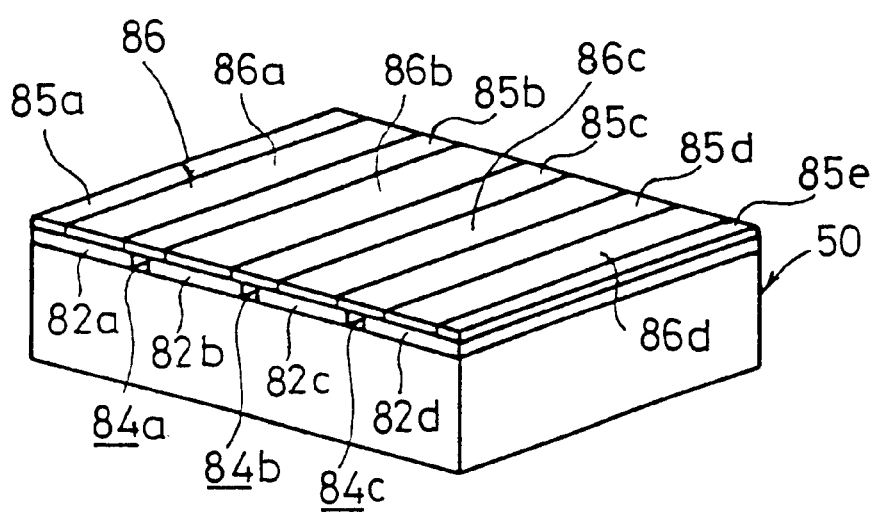
FIG. 21 is a perspective view of the panel of heat sink stock shown in FIG. 20 with first and second plated layers deposited thereon.
Figure 22:
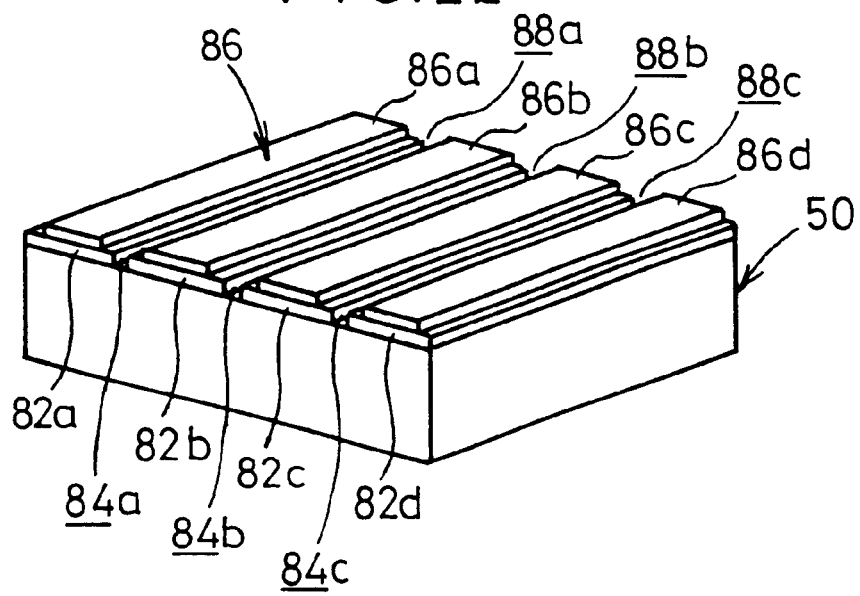
FIG. 22 is a perspective view of the panel of heat sink stock shown in FIG. 21 from which the finish plating masks have been removed.
Figure 23:
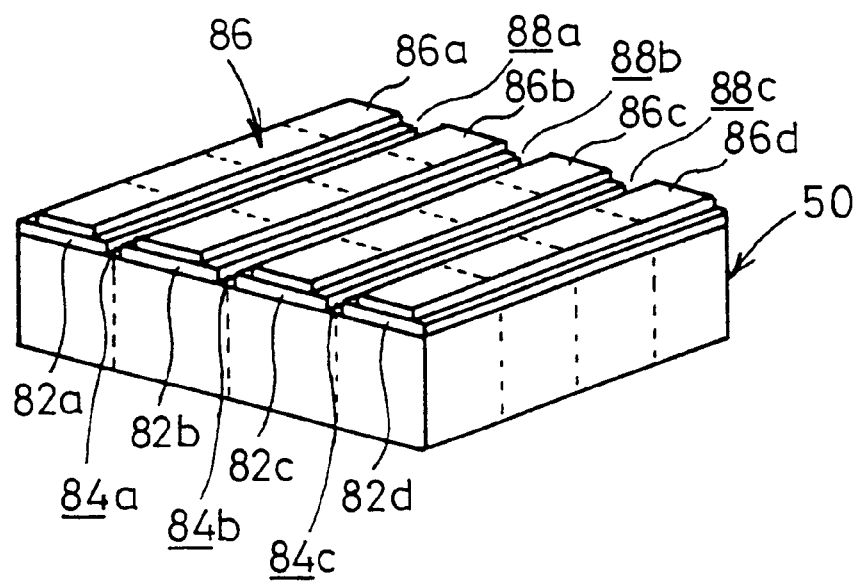
FIG. 23 is a perspective view of the panel of heat sink stock shown in FIG. 22 which has been cut.
Figure 24:
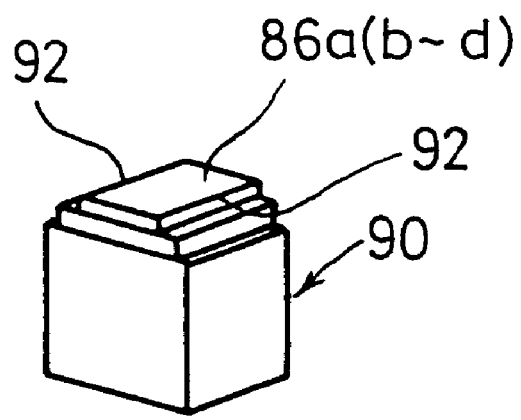
FIG. 24 is a perspective view of a heat sink cut off the panel of heat sink stock shown in FIG. 23.

Then, as shown in FIG. 17, a plurality of rough plating masks (first plating masks) 80a through 80c, each in the shape of a strip, are deposited on the mirror surface 52. The rough plating masks 80a through 80c are spaced at substantially equal intervals and extend substantially parallel to each other.

Then, the mirror surface 52 between the rough plating masks 80a through 80c is electroplated, using a plating solution of copper, thus producing a first plated layer 82 of copper having a desired thickness (see FIG. 18) between the rough plating masks 80a through 80c.

The rough plating masks 80a through 80c are removed from the panel 50, leaving a plurality of substantially parallel projections 82a through 82d, each in the shape of a strip, of the first plated layer 82 on the mirror surface 52. Since the rough plating masks 80a through 80c have been removed, first grooves 84a through 84e (see FIG. 19) are present between the projections 82a through 82d. Then, a plurality of finish plating masks (second plating masks) 85a through 85e (see FIG. 20), each in the shape of a strip, are deposited on the first plated layer 82 over and along the respective first grooves 84a through 84c and opposite ends of the first plated layer 82. The finish plating masks 85a through 85e are spaced at substantially equal intervals and extend substantially parallel to each other.

Then, the first plated layer 82 between the finish plating masks 85a through 85e is electroplated, using a plating solution of copper, thus producing a second plated layer 86 of copper having a desired thickness (see FIG. 21) between the finish plating masks 85a through 85e. The finish plating masks 85a through 85e are then removed from the panel 50, leaving a plurality of substantially parallel projections 86a through 86d of the second plated layer 86 on the first plated layer 82. Since the finish plating masks 85a through 85e have been removed, second grooves 88a through 88c (see FIG. 22) are present between the projections 86a through 86d.

Figure 25:
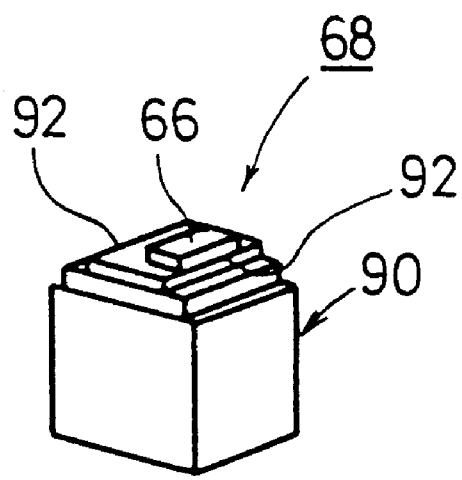
FIG. 25 is a perspective view of the heat sink shown in FIG. 24 on which an LD chip is fixedly mounted.
Figure 28:
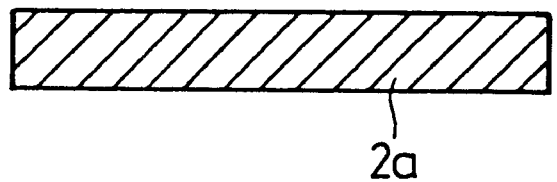
FIG. 28 is a cross-sectional view showing an acceptable shape for a heat sink for use in the semiconductor laser device shown in FIG. 27.
Figure 29:
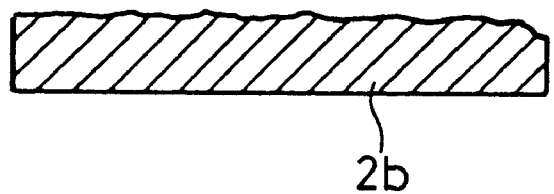
FIG. 29 is a cross-sectional view showing an unacceptable shape for a heat sink for use in the semiconductor laser device shown in FIG. 27.
Figure 30:
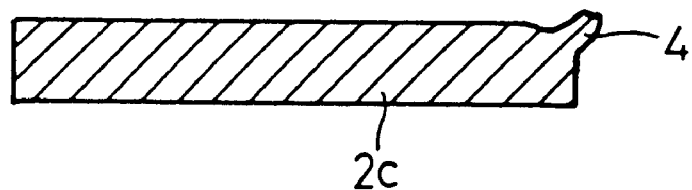
FIG. 30 is a cross-sectional view showing another unacceptable shape for a heat sink for use in the semiconductor laser device shown in FIG. 27.

The panel 50 is linearly cut along the first grooves 84a through 84c and the second grooves 88a through 88c by a wire cutting machine or the like, producing elongate segments. The elongate segments are then transversely cut to desired dimensions along the dotted lines, thereby producing a plurality of heat sinks 90 (see FIGS. 22, 23). As shown in FIG. 25, an LD chip 66 is then fixed to each of the heat sinks 90 by a brazing filler metal or the like. Now, an LD 68 is completed.

The heat sink 90 thus manufactured has an edge 92 which is of a shape similar to that of the heat sink 62 produced by the etching processes according to the third embodiment, and offers the same advantages as those of the third embodiment.

In the fourth embodiment, the plated layers of copper are deposited. However, the mirror surface 52 may be plated with a brazing material such as solder. If mirror surface 52 is plated with such a brazing material, then the accurate shape of the edge 92 can be formed and the brazing material can be applied at the same time.

Alternatively, a plated layer of nickel or the like may be deposited, in place of the plated layers of copper, as a base layer for bonding the LD chip 66 and the heat sink 90 to each other.

In the second and fourth embodiments, a copper layer and a solder layer may be plated on a panel, as shown in FIG. 26. Specifically, as shown in FIG. 26, first layers 42, 94 of copper are deposited on mirror surfaces 12, 52 of heat sinks 36, 90, providing accurate edges 38, 92. Second layers 44, 96 of solder are deposited on the first layers 42, 94 for bonding the LD chip 26. In this manner, the LD chip 26 can accurately be installed by brazing.

Furthermore, in the second and fourth embodiments, an electroless plating process, a sputtering process, a metal vapor deposition process, or the like may be employed instead of the electroplating process to deposit the projections 32a through 32d, 82a through 82d, 86a through 86d on the mirror surfaces 12, 52.

Moreover, in the second and fourth embodiments, the surface finish accuracy of the mirror surfaces 12, 52 may be lowered, and after the plated layer or layers have been deposited to a thickness of 10 μm or more, the ends of the heat sinks 36, 90 from which the laser beams from the LD chips 26, 66 are radiated may be round by a mechanical machining process.

In the second and fourth embodiments, rather than grinding the surfaces of the panels 10, 50 with a single-point tool of diamond, the surfaces of the panels 10, 50 may be lapped and then polished by the CMP process. If a required level of surface finish accuracy for the mirror surfaces 12, 52 is low, then the surfaces of the panels 10, 50 may be lapped only rather than being ground to a highly accurate finish.

The present invention offers the following advantages:

An edge of a heat sink is formed between a groove and a mirror surface or between a projection and a mirror surface. This allows the production at a stable rate of heat sinks each having a desired ultrahigh level of surface finish accuracy over an entire surface thereof up to its edges, free of any unwanted burrs and drooping surfaces. The heat sinks can be manufactured relatively inexpensively as investments in facilities for highly accurate mechanical machining are reduced.

Alternatively, grooves are defined in a mirror surface of a panel by two successive etching processes, or projections are formed on a mirror surface of a panel by two successive etching processes. An edge of a heat sink is formed between such a groove and a mirror surface or between such a projection and a mirror surface. This allows the production at a stable rate of heat sinks each having a desired ultrahigh level of surface finish accuracy over an entire surface thereof up to its edges, free of any unwanted burrs and drooping surfaces. The heat sinks can be manufactured relatively inexpensively as investments in facilities for highly accurate mechanical machining are reduced.

Although certain preferred embodiments of the present invention have been shown and described in detail, it should be understood that various changes and modifications may be made therein without departing from the scope of the appended claims.

What is claimed is:

1. A method of manufacturing a heat sink for a semiconductor laser device, comprising the steps of:
   processing a surface of a base into a mirror surface; and
   defining a groove in said mirror surface, said groove and said mirror surface jointly providing an edge therebetween.

2. A method according to claim 1, wherein said groove is defined by placing a photomask having a predetermined pattern on said mirror surface, and etching said mirror surface through said photomask.

3. A method of manufacturing a heat sink for a semiconductor laser device, comprising the steps of:
processing a surface of a base into a mirror surface; and
forming a projection on said mirror surface, said projection and said mirror surface jointly providing an edge therebetween.

4. A method according to claim 3, wherein said projection is formed by placing a plating mask having a predetermined pattern on said mirror surface, and plating said mirror surface through said plating mask thereby producing a plated layer as said projection.

5. A method of manufacturing heat sinks for semiconductor laser devices, comprising the steps of:
processing a surface of a panel into a mirror surface;
forming a plurality of substantially parallel photomasks spaced at predetermined intervals on said mirror surface;
etching said mirror surface through said photomasks to define grooves, said grooves and said mirror surface jointly providing edges therebetween;
removing said photomasks from said panel; and
thereafter, cutting said panel along said grooves into a plurality of heat sinks.

6. A method of manufacturing heat sinks for semiconductor laser devices, comprising the steps of:
processing a surface of a panel into a mirror surface;
forming a plurality of substantially parallel plating masks spaced at predetermined intervals on said mirror surface;
plating said mirror surface through said plating masks to form projections of a plated layer between said plating masks, said projections and said mirror surface jointly providing edges therebetween;
removing said plating masks from said panel, leaving grooves between said projections; and
thereafter, cutting said panel along said grooves into a plurality of heat sinks.

7. A method according to claim 6, wherein said plated layer comprises at least a single layer of copper, nickel or solder.

8. A method according to claim 6, wherein said plated layer comprises a first layer of copper or nickel deposited on said panel and a second layer of solder deposited on said first layer.

9. A method of manufacturing heat sinks for semiconductor laser devices, comprising the steps of:
processing a surface of a panel into a mirror surface;
forming a plurality of substantially parallel first photomasks spaced at predetermined intervals on said mirror surface;
etching said mirror surface through said first photomasks to form first grooves in said mirror surface;
removing said first photomasks from said panel;
thereafter, forming a plurality of substantially parallel second photomasks spaced at predetermined intervals on said mirror surface;
etching said mirror surface through said second photomasks to form second grooves in said mirror surface respectively at said first grooves, said second grooves and said mirror surface jointly making edges therebetween;
removing said second photomasks from said panel; and
thereafter, cutting said panel along said second grooves into a plurality of heat sinks.

10. A method of manufacturing heat sinks for semiconductor laser devices, comprising the steps of:
processing a surface of a panel into a mirror surface;
forming a plurality of substantially parallel first plating masks spaced at predetermined intervals on said mirror surface;
plating said mirror surface through said first plating masks to form a plated layer on said mirror surface between said first plating masks;
removing said first plating masks from said base;
thereafter, forming a plurality of substantially parallel second plating masks spaced at predetermined intervals on said first plated layer;
plating said first plated layer through said second plating masks to form a plated layer on said first plated layer between said second plating masks, said first and second plated layers providing projections, said projections and said mirror surface jointly forming edges therebetween;
removing said second plating masks from said panel; and
thereafter, cutting said panel along grooves between said projections into a plurality of heat sinks.

11. A method according to claim 10, wherein each of said first and second plated layers comprises a single layer of copper, nickel, or solder.

12. A heat sink for a semiconductor laser device, manufactured by:
processing a surface of a panel into a mirror surface;
forming a plurality of substantially parallel photomasks spaced at predetermined intervals on said mirror surface;
etching said mirror surface through said photomasks to define grooves, said grooves and said mirror surface jointly providing edges therebetween;
removing said photomasks from said panel; and
thereafter, cutting said panel along said grooves.

13. A heat sink for a semiconductor laser device, manufactured by:
processing a surface of a panel into a mirror surface;
forming a plurality of substantially parallel plating masks spaced at predetermined intervals on said mirror surface;
plating said mirror surface through said plating masks to form projections of a plated layer between said plating masks, said projections and said mirror surface jointly providing edges therebetween;
removing said plating masks from said panel, leaving grooves between said projections; and
thereafter, cutting said panel along said grooves.

14. A heat sink for a semiconductor laser device, manufactured by:
processing a surface of a panel into a mirror surface;
forming a plurality of substantially parallel first photomasks spaced at predetermined intervals on said mirror surface;
etching said mirror surface through said first photomasks to form first grooves in said mirror surface;
removing said first photomasks from said panel;
thereafter, forming a plurality of substantially parallel second photomasks spaced at predetermined intervals on said mirror surface;

etching said mirror surface through said second photomasks to form second grooves in said mirror surface respectively at said first grooves, said second grooves and said mirror surface jointly making edges therebetween;

removing said second photomasks from said panel; and thereafter, cutting said panel along said second grooves.

15. A heat sink for a semiconductor laser device, manufactured by:

processing a surface of a panel into a mirror surface;

forming a plurality of substantially parallel first plating masks spaced at predetermined intervals on said mirror surface;

plating said mirror surface through said first plating masks to form a plated layer on said mirror surface between said first plating masks;

removing said first plating masks from said base;

thereafter, forming a plurality of substantially parallel second plating masks spaced at predetermined intervals on said first plated layer;

plating said first plated layer through said second plating masks to form a plated layer on said first plated layer between said second plating masks, said first and second plated layers providing projections, said projections and said mirror surface jointly forming edges therebetween;

removing said second plating masks from said panel; and thereafter, cutting said panel along grooves between said projections.

* * * * *

UNITED STATES PATENT AND TRADEMARK OFFICE
CERTIFICATE OF CORRECTION

PATENT NO. : 6,355,505 B1
DATED : March 12, 2002
INVENTOR(S) : Hiroshi Maeda et al.

It is certified that error appears in the above-identified patent and that said Letters Patent is hereby corrected as shown below:

<u>Title page,</u>
Foreign Application Priority Data,
-- April 8, 1998      JP    10-96449 --
-- September 30, 1998  JP   10-278756 --

Signed and Sealed this

Tenth Day of September, 2002

*Attest:*

*Attesting Officer*

JAMES E. ROGAN
*Director of the United States Patent and Trademark Office*